(12) United States Patent
Li (10) Patent No.: US 7,285,312 B2
(45) Date of Patent: Oct. 23, 2007

(54) ATOMIC LAYER DEPOSITION FOR TURBINE COMPONENTS

(75) Inventor: Chien-Wei Li, Livingston, NJ (US)

(73) Assignee: Honeywell International, Inc., Morristown, NJ (US)

(*) Notice: Subject to any disclaimer, the term of this patent is extended or adjusted under 35 U.S.C. 154(b) by 268 days.

(21) Appl. No.: 10/759,810

(22) Filed: Jan. 16, 2004

(65) Prior Publication Data
US 2005/0158590 A1 Jul. 21, 2005

(51) Int. Cl.
- C23C 14/30 (2006.01)
- C23C 16/32 (2006.01)
- C23C 16/34 (2006.01)
- C23C 16/36 (2006.01)
- C23C 16/40 (2006.01)
- C23C 16/42 (2006.01)

(52) U.S. Cl. .......... 427/567; 427/566; 427/255.28; 427/255.31; 427/249.15; 427/249.17; 427/255.394

(58) Field of Classification Search .......... None
See application file for complete search history.

(56) References Cited

U.S. PATENT DOCUMENTS

| | | | |
|---|---|---|---|
| 3,819,990 A * | 6/1974 | Hayashi et al. ........... | 361/313 |
| 5,305,143 A * | 4/1994 | Taga et al. ............... | 359/488 |
| 5,562,998 A | 10/1996 | Strangman | |
| 5,660,697 A * | 8/1997 | Kawashima et al. ... | 204/192.22 |
| 5,855,753 A | 1/1999 | Trau et al. | |
| 5,998,003 A | 12/1999 | Courtright et al. | |
| 6,103,386 A | 8/2000 | Raybould et al. | |

(Continued)

FOREIGN PATENT DOCUMENTS

JP 4-182385 * 6/1992 .......... 117/95

(Continued)

OTHER PUBLICATIONS

"Fabrication Procedure to Obtain High Quality Tantalum Pentoxide Films on Silicon", IBM Technical Disclosure Bulletin, vol. 27, No. 10A, pp. 5896-5898, Mar. 1, 1985.*

(Continued)

Primary Examiner—Marianne Padgett
(74) Attorney, Agent, or Firm—Ingrassia Fisher & Lorenz (57) ABSTRACT

A method and superalloy component for depositing a layer of material onto gas turbine engine components by atomic layer deposition. A superalloy component may have a ceramic thermal barrier coating on at least a portion of its surface, comprising a superalloy substrate and a bonding coat; and aluminum oxide ($Al_2O_3$) layer may be deposited on top of an yttria-stabilized zirconia layer and form a bonding coat by atomic layer deposition. The yttria-stabilized zirconia layer may have a plurality of micron sized gaps extending from the top surface of the ceramic coating towards the substrate and defining a plurality of columns of the yttria-stabilized zirconia layer. Also, atomic layer deposition may be used to lay an aluminum oxide ($Al_2O_3$) layer over a tantalum oxide ($Ta_2O_5$) layer on a silicon-based substrate. Using atomic layer deposition to coat the gas turbine engine components permits conformal coating of the columnar surface to permit gap expansion and contraction without sintering of the columnar surface or spalling of the coating, and form an oxidation resistant bonding coat.

6 Claims, 4 Drawing Sheets

U.S. PATENT DOCUMENTS

| | | | |
|---|---|---|---|
| 6,203,613 B1 | 3/2001 | Gates et al. | |
| 6,203,927 B1 | 3/2001 | Subramanian et al. | |
| 6,277,681 B1 * | 8/2001 | Wallace et al. | 438/198 |
| 6,335,238 B1 * | 1/2002 | Hanttangady et al. | 438/240 |
| 6,416,870 B1 | 7/2002 | Hunt et al. | |
| 6,482,537 B1 * | 11/2002 | Strangman et al. | 428/633 |
| 6,486,021 B2 * | 11/2002 | Kim et al. | 438/240 |
| 6,492,038 B1 | 12/2002 | Rigney et al. | |
| 6,503,330 B1 | 1/2003 | Sneh et al. | |
| 6,563,183 B1 * | 5/2003 | En et al. | 257/410 |
| 6,582,779 B2 * | 6/2003 | Li et al. | 427/585 |
| 6,585,823 B1 | 7/2003 | Van Wijck | |
| 6,586,115 B2 * | 7/2003 | Rigney et al. | 428/633 |
| 6,982,126 B2 * | 1/2006 | Darolia et al. | 428/701 |
| 2002/0172838 A1 * | 11/2002 | Rigney et al. | 428/633 |
| 2003/0026989 A1 | 2/2003 | George et al. | |
| 2003/0059633 A1 | 3/2003 | Ackerman et al. | |
| 2003/0207031 A1 * | 11/2003 | Strangman et al. | 427/255.32 |
| 2004/0125541 A1 * | 7/2004 | Chung | 361/306.3 |
| 2005/0112381 A1 * | 5/2005 | Raybould et al. | 428/446 |
| 2005/0112412 A1 * | 5/2005 | Darolia et al. | 428/702 |
| 2006/0246319 A1 * | 11/2006 | Bye et al. | 428/698 |

FOREIGN PATENT DOCUMENTS

| | | | |
|---|---|---|---|
| JP | 5-47473 | * | 2/1993 |
| WO | WO 03/058734 A1 | | 7/2003 |

OTHER PUBLICATIONS

Ritala, Mikko, et al., *Atomic Layer Deposition*, Handbook of Thin Film Materials, Oct. 2001, vol. 1, Chapter 2; San Diego, U.S.

Sneh, Ofer, et al.; *Thin Film Atomic Layer Deposition Equipment for Semiconductor Processing*; Thin Solid Films 402 (2002); pp. 248-261, no month.

* cited by examiner

DEPOSIT A TANTALUM OXIDE ($Ta_2O_5$) LAYER ONTO A SILICON-BASED SUBSTRATE (ONE OF A SILICON NITRIDE SUBSTRATE AND A SILICON CARBIDE SUBSTRATE), BY ELECTRON BEAM PHYSICAL VAPOR DEPOSITION, SUCH THAT THE TANTALUM OXIDE ($Ta_2O_5$) LAYER IS IN THE FORM OF COLUMNAR GRAINS.

210

DEPOSIT AN INORGANIC LAYER (SELECTED FROM THE GROUP CONSISTING OF ALUMINUM OXIDE ($Al_2O_3$), TANTALUM CARBIDE (TaC), HAFNIUM OXIDE ($HfO_2$), MIXTURES THEREOF, NANO-LAMINATES THEREOF, AND ALLOYS THEREOF, OR SELECTED FROM THE GROUP CONSISTING OF SILICON CARBIDE (SiC), SILICON NITRIDE ($Si_3N_4$), OXYCARBIDES, CARBONITRIDES, MIXTURES THEREOF, NANO-LAMINATES THEREOF, AND ALLOYS THEREOF), BY ATOMIC LAYER DEPOSITION, ONTO THE TANTALUM OXIDE ($Ta_2O_5$) LAYER, SUCH THAT THE INORGANIC LAYER IS UNIFORM AND CONFORMAL.

DEPOSIT AN YTTRIA-STABILIZED ZIRCONIA LAYER ONTO A NICKEL SUPERALLOY TURBINE COMPONENT (SELECTED FROM THE GROUP CONSISTING OF A TURBINE BLADE, A TURBINE VANE, A COMBUSTOR FUEL NOZZLE, AND A COMBUSTOR SHIELD), BY ELECTRON BEAM PLASMA VAPOR DEPOSITION, SUCH THAT THE YATTRIA-STABILIZED ZIRCONIA LAYER IS IN THE FORM OF COLUMNAR GRAINS.

230

DEPOSIT AN INORGANIC LAYER (SELECTED FROM THE GROUP CONSISTING OF ALUMINUM OXIDE ($Al_2O_3$), TANTALUM CARBIDE (TaC), TANTALUM OXIDE ($Ta_2O_5$) HAFNIUM OXIDE ($HfO_2$), MIXTURES THEREOF, NANO-LAMINATES THEREOF, AND ALLOYS THEREOF; OR SELECTED FROM THE GROUP CONSISTING OF SILICON CARBIDE (SiC), SILICON NITRIDE ($Si_3N_4$), OXYCARBIDES, CARBONITRIDES, MIXTURES THEREOF, NANO-LAMINATES THEREOF, AND ALLOYS THEREOF), BY ATOMIC LAYER DEPOSITION, ONTO THE YTTRIA-STABILIZED ZIRCONIA LAYER, SUCH THAT THE INORGANIC LAYER IS UNIFORM AND CONFORMAL.

ATOMIC LAYER DEPOSITION FOR TURBINE COMPONENTS

BACKGROUND OF THE INVENTION

This invention relates generally to thermal barrier and environmental barrier coatings for metallic and ceramic substrates and in particular to thermal barrier coatings and environmental barrier coatings that are resistant to sintering and oxidation damage for components in gas turbine engines.

As gas turbine engine technology advances and engines are required to be more efficient, gas temperatures within the engines continue to rise. However, the ability to operate at these increasing temperatures is limited by the ability of the superalloy turbine blades and vanes to maintain their mechanical strength when exposed to the heat, oxidation, and corrosive effects of the impinging gas. One approach to this problem has been to apply a protective thermal barrier coating (TBC) or environmental barrier coating (EBC) which insulates the blades and vanes from higher gas temperatures and hot gas corrosion, and to apply an interfacial bonding coat between the thermal barrier coating and the substrate to inhibit oxidation. The TBC for metallic substances typically consists mainly of $ZrO_2$ ceramic, which is known to have low thermal conductivity and therefore reduces the substrate temperature under gas turbine engine operating conditions. Typically, the $ZrO_2$ ceramic TBC contains additives to stabilize the crystalline structure and prevent the phase transformation as the TBC goes through temperature cycles. The most common additive for stabilizing the zirconia is $Y_2O_3$.

For high performance turbine blade and vane applications where the surface finish and lifetime of the coating are important, Electron Beam Physical Vapor Deposition (EBPVD) TBC is often used to coat substrates. Furthermore, to have low thermal conductivity, it is desirable that the TBC contains pores or other microstructure features that can scatter phonons. Typically, the EBPVD TBC will have an outer ceramic layer that has a columnar-grained microstructure. Gaps between the individual columns allow the columnar grains to expand and contract without developing stresses that could cause spalling. Strangman, U.S. Pat. Nos. 4,321,311; 4,401,697; and 4,405,659, discloses a thermal barrier coating system for a superalloy substrate that contains a MCrAlY layer, an alumina layer, and an outer columnar-grained ceramic layer. Duderstadt et al., U.S. Pat. No. 5,238,752 and Strangman, U.S. Pat. No. 5,514,482 disclose a thermal barrier coating system for a superalloy substrate that contains an aluminide layer, an alumina layer, and an outer columnar-grained ceramic layer.

A problem with columnar-grained ceramic layers is that when exposed to temperatures over 1100 degrees C. (2012 degrees F.) for substantial periods, sintering of the columnar grains occurs. As the columnar grains undergo thermal expansion, the columnar grains impinge upon each other. The gaps between columnar grains close as adjacent, columnar grains bond together from sintering. Once the gaps become closed, the ceramic layer can no longer accommodate the thermal expansion and may spall or crack. The same problem also exists in plasma sprayed TBC, in which the pores and gaps in the typical laminar structure are sintered at use temperatures. In addition, sintering of the TBC increases the thermal conductivity of the coating, which is undesirable, since the thermal insulation property of the coating degrades and the temperature in the substrate increases. Frequent maintenance of turbine components is required due to the tendency for sintering of the TBC which causes the TBC to spall or crack and increase thermal conductivity. Conventionally, after about 100 cycles, turbine components must be removed to blast away the TBC or the EBC and then the turbine component is coated again. If a coating could be made more resistant to spalling, cracking and increases in thermal conductivity, then costly disassembly and maintenance may be minimized.

There have been attempts in the prior art to solve the problem of sintering of columnar grains in the EBPVD TBC or pores and gaps in the plasma-sprayed TBC. For zirconia-based TBC, one of the methods is to incorporate a material such as $Al_2O_3$ into the gaps or on the columnar grain surface. In principle, the existence of alumina in the gap or on the grain surface inhibits the sintering of the columnar grains, and can extend the lifetime of the EBPVD or plasma sprayed TBC. However, coating methods in the manner of the prior art tend to produce a coating that does not conform to the topography of the columnar grains. Instead, the coating adheres to only the top surface of the columnar grains. This can significantly reduce the effectiveness of the sintering inhibiting property of the coating. Another problem associated with the prior art coating on the top portion of the TBC is the thermal expansion and modulus mismatch created by the inhomogeneous distribution of the coating, which can shorten the bonding life of the TBC on the substrate.

Another major problem with a common TBC, such as a TBC containing $ZrO_2$, $HfO_2$ and $Ta_2O_5$, is poor oxidation barrier properties. These materials have the strong tendency to be in non-stoichiometric quantities with oxygen deficient structure. With the inherent high oxygen vacancy concentrations in these materials, oxygen atoms can move rapidly inside the materials. As a result, oxygen atoms, ions and molecules can diffuse easily from the environment through the TBC down to the bonding coat region, and attack the bonding coat and substrate underneath. Because of this poor oxygen diffusion barrier property, a TBC containing $ZrO_2$, $HfO_2$, or $Ta_2O_5$ is not effective at all in protecting the substrate from oxidation at high temperatures. Because of this problem, the substrate needs to be protected from oxidation by a bonding coat, such as alumina, platinum, platinum aluminide, and the like. However, even the bonding coat cannot sustain the oxidation attack for long, and a common failure mechanism of TBC is directly due to the formation and growth of thermally grown alumina due to oxidation at the interface between the substrate and the TBC.

The prior art is not specifically intended for high performance applications under extreme conditions, and some suffer from one or more of the following disadvantages:
 a) non-conformity of coating layers.
 b) inability to sustain high temperature conditions.
 c) increased spalling and cracking.
 d) subject to excessive oxygen diffusion.

As can be seen, there is a need for an improved apparatus and method for turbine components comprising inorganic layers applied to ceramic layer coatings that are resistant to sintering, conform to columnar grain topography, withstand higher temperatures and extreme conditions, resistant to oxygen diffusion, and minimize spalling and cracking.

SUMMARY OF THE INVENTION

In one aspect of the present invention, a superalloy component having a ceramic thermal barrier coating on at least a portion of its surface, comprises a superalloy substrate; a ceramic coating overlying the superalloy substrate, the ceramic coating having a plurality of gaps extending from the top surface of the ceramic coating towards the substrate and defining a plurality of columns of the ceramic coating; and an inorganic layer overlying the ceramic coating and conformally coating the plurality of gaps; wherein the inorganic layer is deposited over the ceramic coating by atomic layer deposition.

In an alternative aspect of the present invention, a superalloy component having a ceramic thermal barrier coating on at least a portion of its surface, comprises a superalloy substrate; an yttria-stabilized zirconia layer overlying the superalloy substrate, the yttria-stabilized zirconia layer having a plurality of gaps extending from the top surface of the ceramic coating towards the substrate and defining a plurality of columns of the yttria-stabilized zirconia layer; and an aluminum oxide ($Al_2O_3$) layer overlying the yttria-stabilized zirconia layer and, conformally coating the plurality of gaps; wherein the aluminum oxide ($Al_2O_3$) layer is deposited over the yttria-stabilized zirconia layer by atomic layer deposition.

In another aspect of the present invention, a component having a ceramic environmental barrier coating on at least a portion of its surface, comprises a silicon-based substrate; a tantalum oxide ($Ta_2O_5$) layer overlying the silicon-based substrate, having a plurality of gaps extending from the top surface of the tantalum oxide ($Ta_2O_5$) layer towards the silicon-based substrate, and defining a plurality of columns of the tantalum oxide ($Ta_2O_5$) layer; and an aluminum oxide ($Al_2O_3$) layer overlying the tantalum oxide ($Ta_2O_5$) layer, conformally coating the plurality of gaps; wherein the aluminum oxide ($Al_2O_3$) layer is deposited over the tantalum oxide ($Ta_2O_5$) layer by atomic layer deposition.

In yet another aspect of the present invention, a superalloy component having a ceramic thermal barrier coating on at least a portion of its surface, comprises a superalloy substrate; a first coating layer overlying the superalloy substrate, the first coating layer having a thickness from about 5 nm to 5000 nm; the first coating layer having a plurality of gaps extending from the top surface of the first coating layer towards the substrate and defining a plurality of columns of the first coating layer; and a second coating layer overlying the first coating layer and conformally coating the plurality of gaps; wherein the second coating layer is deposited over the first coating layer by atomic layer deposition.

In still another aspect of the present invention, a method for coating a silicon-based substrate, comprises: depositing a tantalum oxide ($Ta_2O_5$) layer onto a silicon-based substrate, by electron beam physical vapor deposition, such that the tantalum oxide ($Ta_2O_5$) layer is in the form of columnar grains; and depositing an inorganic layer, by atomic layer deposition, onto the tantalum oxide ($Ta_2O_5$) layer, such that the inorganic layer is uniform and conformal.

In further aspect of the present invention, a method for coating nickel-based superalloy gas turbine components, comprises- depositing an yttria-stabilized zirconia layer onto a nickel superalloy turbine component, by electron beam plasma vapor deposition, such that the yttria-stabilized zirconia layer is in the form of columnar grains; and depositing an inorganic layer, by atomic layer deposition, onto the yttria-stabilized zirconia layer, such that the inorganic layer is uniform and conformal.

In yet another aspect of the present invention, a method for coating a substrate comprises etching chemically a thermal barrier coating such that the thermal barrier coating is in the form of columnar grains; and depositing an inorganic layer, by atomic layer deposition, onto the thermal barrier coating, using atomic layer deposition, such that the inorganic layer is uniform and conformal.

These and other aspects, objects, features and advantages of the present invention, are specifically set forth in, or will become apparent from, the following detailed description of a preferred embodiment of the invention when read in conjunction with the accompanying drawings.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Figure 1:
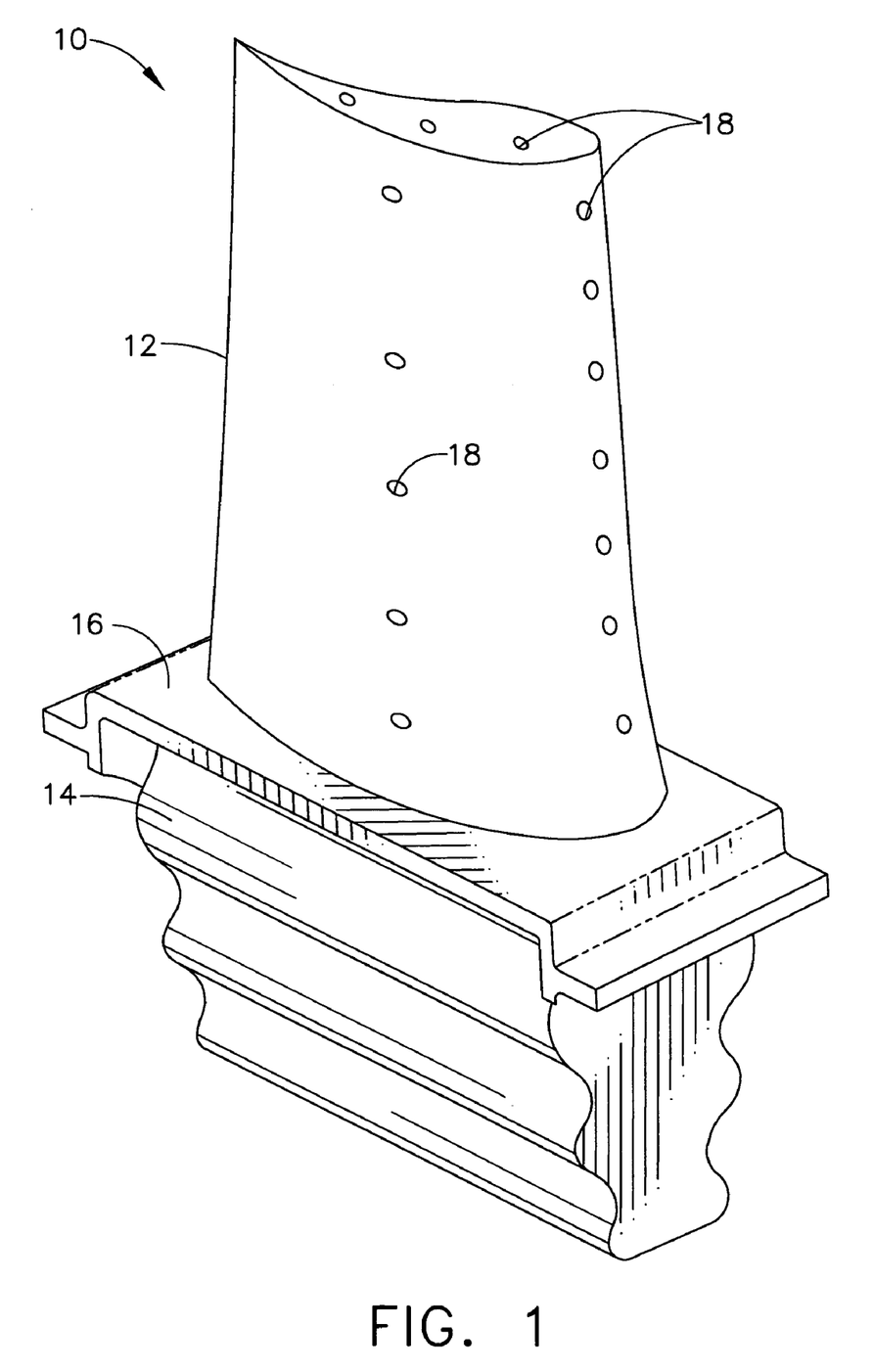
FIG. 1 is an isometric view of a turbine blade, according to an embodiment of the present invention.

The present invention is generally applicable to components that operate within environments characterized by relatively high temperatures (e.g., temperatures in excess of about 1100 degrees C.), and are therefore subjected to severe thermal stresses and thermal cycling. Notable examples of such components include the high and low pressure turbine nozzles and blades, shrouds, vanes, combustor liners, combustor fuel nozzles, combustor shields, and augmentor hardware of gas turbine engines. One such example is the turbine blade 10 shown in FIG. 1. The turbine blade 10 generally includes an airfoil 12 against which hot combustion gases may be directed during operation of a gas turbine engine (not shown), and whose surface may therefore be subjected to severe attack by oxidation, corrosion and erosion. The airfoil 12 may be anchored to a turbine disk (not shown) with a dovetail 14 formed on a root section 16 of the turbine blade 10. Cooling passages 18 may be present in the airfoil 12 through which bleed air may be forced to transfer heat from the blade 10. While the advantages of this invention will be described with reference to the turbine blade 10 shown in FIG. 1, the teachings of this invention are generally applicable to any component on which an environmental or thermal barrier coating system may be used to protect the component from its environment.

Coating methods in the prior art tend to produce a coating that does not conform to the topography of the columnar grains. Instead, the coating may adhere to only the top surface of the columnar grains. Because substrates and coatings typically have relatively different coefficients of thermal expansion, coatings may not expand at the same rate as the substrates. As temperature increases (e.g., around 1400 degrees C.), the surface grains expand. Upon surface grain expansion, the adjacent grains make contact and sinter. After frequent exposure to extreme temperatures, the surface may gradually lose the ability to accommodate thermal expansion strains. Coating the surface grains, by atomic layer deposition to fill surface gaps and microcracks, may reduce the tendency of the gaps and microcracks to close by sintering during service of the silicon-based substrates and turbine components.

Atomic layer deposition can form one atomic layer at a time. Depositing one atomic layer at a time is desirable for creating layers of uniform thickness with controlled composition within surface microcracks and gaps with extremely high conformability. By conforming to the topography of the columnar grain surface, adjacent columnar grain surfaces do not touch each other directly, thereby preventing sintering. This offers significant benefit over the prior art, which used powder slurry, sol-gel, physical vapor deposition, and chemical vapor deposition to attempt to coat the surface of the columnar grains. The prior art methods cannot uniformly coat the surface of the columnar grains, and cannot penetrate deeply to the bottom of the columnar grains. Furthermore, the methods employed in the prior art tend to preferentially coat the upper part surface of the columnar grains where the gap is wider. Consequently, the columnar grains of the TBC with conventional surface coating tend to sinter inhomogeneously due to the non-uniform surface coating during service, and may result in shorter life in the TBC.

Another advantage for the coating of this invention is that the oxidation resistance of the TBC system is much improved over the prior art. The near 100% conformal coating on the columnar grain surface, applied by an atomic layer deposition method, completely seals off the surface previously exposed to the environment by the conformal coating. By depositing a conformal layer of inorganic materials of oxides, carbides, nitrides, silicides, and their compounds of lower oxygen diffusion coefficients than that of the TBC materials such as $ZrO_2$, $HfO_2$ and $Ta_2O_5$, oxygen diffusion through the TBC with conformal surface coating is retarded. As a result, the oxidation resistance of the thermal barrier coating system is improved over the prior art.

Figure 2:
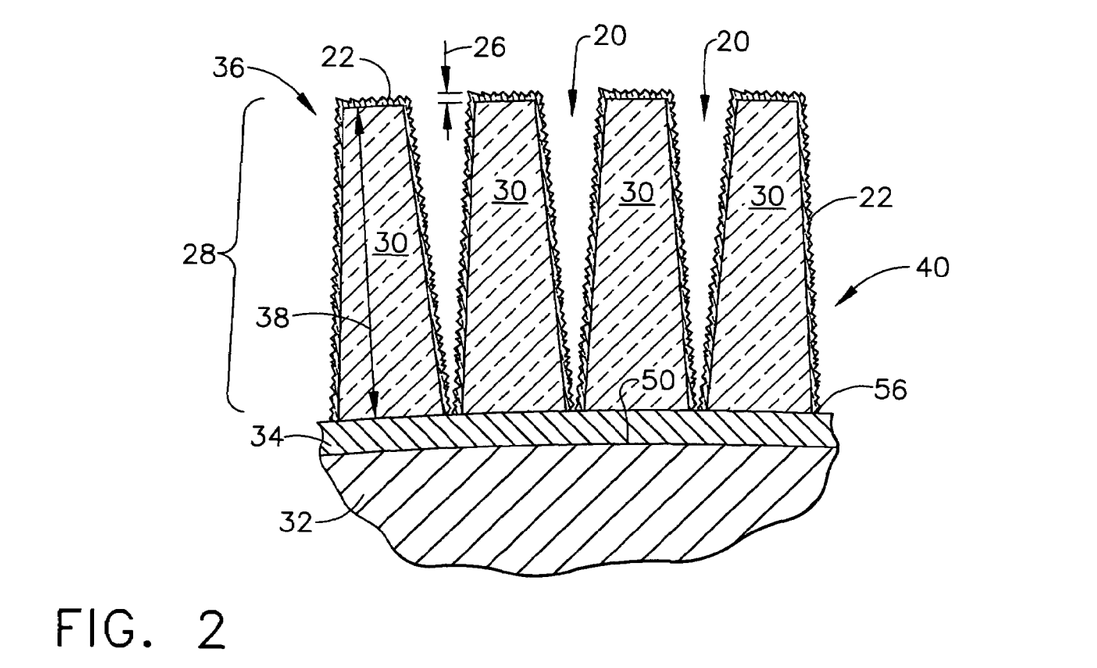
FIG. 2 is a cross sectional schematic view of a coated turbine component according to an embodiment of the present invention.

As shown in FIG. 2, a bonding coat 34 may lie over a superalloy substrate 32, for securely joining subsequent layers (e.g., ceramic layer 28) to the superalloy substrate 32. The bonding coat 34 may be comprised of a MCrAlY alloy. Such alloys have a broad composition of about 10 to about 35% chromium, about 5 to about 15% aluminum, about 0.01 to 1% about yttrium, or hafnium, or lanthanum, with M being the balance. M may be selected from a group consisting of iron, cobalt, nickel, and mixtures thereof. Minor amounts (e.g., about 5% to about 10%) of other elements such as Ta or Si may also be present. The MCrAlY bonding coat 34 may be applied by, for example, electron beam vapor deposition though sputtering and low pressure plasma spraying may also be used. Alternatively, the bonding coat 34 may be comprised of an intermetallic aluminide such as nickel aluminide or platinum aluminide. The aluminide bonding coat 34 may be applied by standard commercially available aluminide processes whereby aluminum is reacted at the superalloy substrate 32 surface 50 to form an aluminum intermetallic compound, which may provide a reservoir for the growth of an alumina scale oxidation resistant layer. Thus the aluminide bonding coat 34 may be predominately composed of an aluminum intermetallic [e.g., NiAl, CoAl, FeAl and (Ni, Co, Fe) Al phases] formed by reacting aluminum vapor species or aluminum rich alloy powder with the superalloy substrate 32 elements at the surface 50.

Diffusion aluminiding may be accomplished by one of several conventional prior art techniques, such as the pack cementation process, spraying, chemical vapor deposition, electrophoresis, sputtering, and slurry sintering with an aluminum rich vapor and appropriate diffusion heat treatments. Other beneficial elements can also be incorporated into diffusion aluminide coatings by a variety of processes. Beneficial elements include Pt, Pd, Si, Hf and oxide particles, such as alumina, yttria, hafnia, for enhancement of alumina scale adhesion; Cr and Mn for hot corrosion resistance; Rh, Ta and Cb for diffusional stability and/or oxidation resistance; and Ni and Co for increasing ductility or incipient melting limits.

In the specific case of platinum modified diffusion aluminide coating layers, the coating phases adjacent to the alumina scale may be platinum aluminide and/or nickel-platinum aluminide phases (on a Ni-base superalloy).

With reference to FIG. 2, it is within the scope of the present invention to apply the method of atomic layer deposition to form bonding coat 34 of the compositions mentioned above, or additional inorganic layers 22 below or above the bonding coat 34 formed from traditional methods to improve oxidation protection properties. The inorganic layers 22 formed by the atomic layer deposition method may reduce the diffusion of oxygen into the substrate 32 or the outward diffusion of alloying elements in the substrate 32. The inorganic coatings formed by atomic layer deposition may be at a thickness in the range of about 5 nm to about 5,000 nm, and preferably at a thickness in the range of about 5 nm to about 2,500 nm. The inorganic layer 22 may comprise a compound of Al, Hf, Si, Ln (rare earth including entire lanthanum series, scandium and yttrium), Mg, Mo, Ni, Nb, Sr, or Ti. In addition, the inorganic layers 22 may be selected from the group consisting of oxides, carbides, nitrides, silicides, and metals. The oxides may be selected from the group consisting of $Al_2O_3$, $Cr_2O_3$, $Sc_2O_3$, $SiO_2$, $ZrO_2$, and $Ta_2O_5$, $HfO_2$, $TiO_2$, $Ln_2O_3$, MgO, SrO, and alloys and compounds thereof. The nitrides may be selected from the group consisting of TaN, ZrN, HfN, TiN, $Si_3N_4$ and alloys and compounds thereof. The carbides may be selected from the group consisting of SiC, TaC, ZrC, HfC and alloys and compounds thereof. The silicides may be selected from the group consisting of $MoSi_2$, $Mo_5Si_3$, $TaSi_2$, $Ta_5Si_3$, and alloys and compounds thereof. The metals may be selected from the group consisting of Pt, Ru, Rd, Ir, and alloys and compounds thereof.

The ceramic layer 28 may be used as a thermal barrier coating or an environmental barrier coating, may be applied onto the bonding coat 34 by electron beam physical vapor deposition (EBPVD) and as result may have a columnar grained microstructure. Ceramic layer 28 includes columnar grains or columns 30 which may be oriented substantially perpendicular to the surface 50 of the superalloy substrate 32. Sub-micron and micron sized gaps 20 may extend between the individual columns 30 from the top 36 of the ceramic layer 28 toward, and within a few microns of, the bonding coat 34. The presence of intercolumnar gaps 20 may reduce the effective modulus (increases compliance) of the bonding coat 34 and the ceramic coating 28. Increased compliance provided by the gaps 20 may enhance ceramic layer 28 durability by eliminating or minimizing stresses associated with thermal gradients and superalloy/coating thermal expansion mismatch strains in the ceramic layer 28. Alternatively, the ceramic layer 28 may be applied by a plasma spray process. Although this process may not produce a columnar microstructure, it may create an interconnected network of subcritical microcracks with micronwidth opening displacements, which reduce the modulus of the ceramic layer 28. The network of subcritical microcracks may perform the same function as the gaps 20. In this application, the term "gap" 20 includes these microcracks.

The ceramic layer 28 may be any of the conventional ceramic compositions used for thermal barrier coatings or environmental barrier coatings. An exemplary composition is a yttria-stabilized zirconia layer, which is zirconia (zirconium oxide) with from about 3 weight % to about 12 weight % yttria (yttrium oxide) added to stabilize the zirconia against phase changes that otherwise occur as a thermal barrier coating is heated and cooled during manufacture and service. Yttria-stabilized zirconia ceramic layers 28 may have a thermal conductivity that is about 1 and one-half orders of magnitude lower than that of the typical superalloy substrate such as MAR-M247. Instead of, or in addition to the yttria, the zirconia may be stabilized with CaO, MgO, $CeO_2$ as well as $Y_2O_3$. Another ceramic believed to be useful in the columnar form, within the scope of the present invention, is hafnia, which may be yttria-stabilized. The particular ceramic material selected should be stable in the high temperature environment of a gas turbine. Another example of a ceramic useful for the ceramic layer 28 is tantalum oxide ($Ta_2O_5$). The thickness 38 of the ceramic layer 28 may vary from about 0.05 mm to about 1.3 mm.

Because of differences in the coefficients of thermal expansion between the superalloy substrate 32 and the ceramic layer 28, when heated or cooled, the superalloy substrate 32 may expand (or contract) at a greater rate than the ceramic layer 28. The gaps 20 allow the columnar grains 30 to expand and contract without producing stresses that would cause the ceramic layer 28 to spall or crack.

Figure 3:
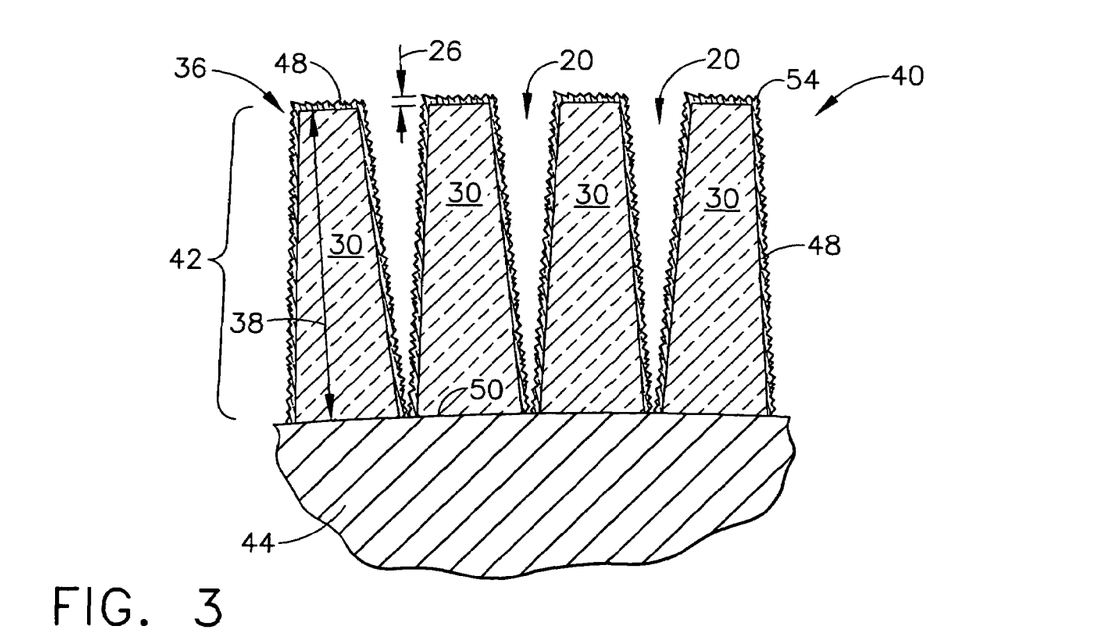
FIG. 3 is a cross sectional schematic view of a coated article, with a silicon-based substrate, according to an embodiment of the present invention.

When exposed to temperatures over 1100 degrees C. (2012 degrees F.) for periods of time, sintering of the columnar grains 30 occurs. The gaps 20 close as adjacent columnar grains 30 bond together. With the gaps 20 closed, the ceramic layer 28 may be less able to accommodate the thermal expansion mismatch and may spall or crack. Resistance to sintering is imparted to the columnar grains 30 by sheathing them with a inorganic layer 22. As shown in FIGS. 2 and 3, the inorganic layer 22 or 48 is applied such that it is conformally coating the plurality of sub-micron and micron sized gaps 20. The inorganic layer 22 may comprise a substance selected from the group consisting of oxides, nitrides, carbides, silicides, metal films (for example, platinum), metal alloy films, and laminates thereof. Additionally, the inorganic layer 22 may comprise a compound (e.g., oxides, nitrides, carbides, borides, silicides) of Al, Hf, Zr, Ta, Si, Ln (rare earth including the entire lanthanum series, scandium and yttrium), Mg, Mo, Ni, Nb, Sr, or Ti. These types of inorganic layers 22 may withstand repeated fluctuations in temperature extremes and thereby inhibit bonding of adjacent grains 30.

The inorganic layer 22 may be applied by atomic layer deposition, at a thickness in the range of about 5 nm to about 5,000 nm, and preferably at a thickness in the range of about 5 nm to about 2,500 nm.

Besides coating superalloy substrates, 32, the present invention also may be useful for coating silicon-based substrates, as shown in FIG. 3. A component 40 having a ceramic environmental barrier coating 42 on at least a portion of its surface 50 may comprise a silicon-based substrate 44, a suitable ceramic environmental barrier coating 42, for example, a tantalum oxide ($Ta_2O_5$) layer overlying the silicon-based substrate 44; and a suitable material to prevent sintering, for example, an aluminum oxide ($Al_2O_3$) layer 48 overlying the ceramic environmental barrier coating 42; wherein the aluminum oxide ($Al_2O_3$) layer 48 may be deposited over the ceramic environmental barrier coating 42 by atomic layer deposition.

Figure 4:
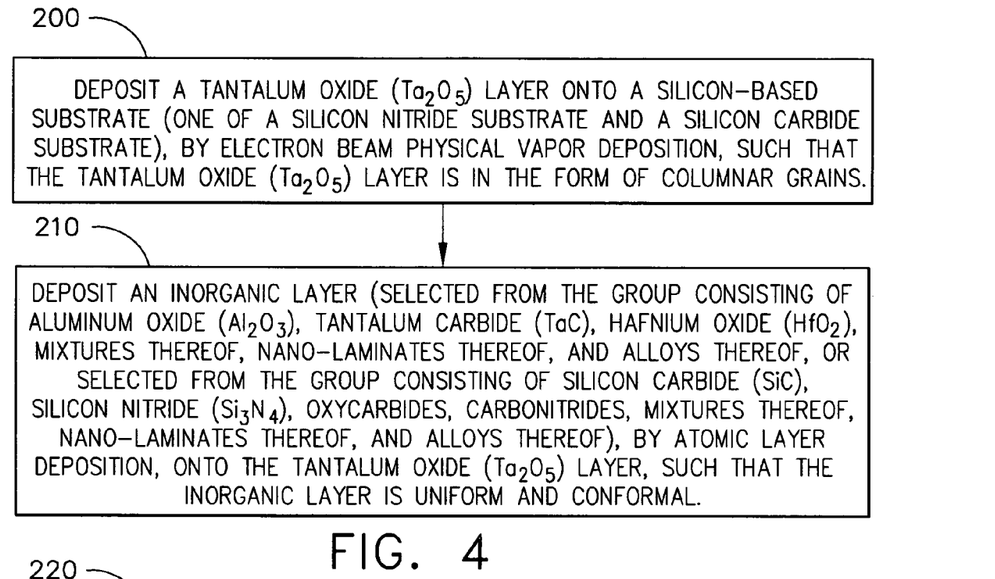
FIG. 4 is a flowchart demonstrating a method for coating a silicon-based substrate, according to an embodiment of the present invention.

A method for depositing an environmental barrier coating onto a silicon-based substrate 44 may be shown with reference to step 200 in the flow chart in FIG. 4 and FIG. 3. A suitable ceramic environmental barrier coating 42, for example, a tantalum oxide ($Ta_2O_5$) layer may be deposited onto a silicon-based substrate 44 with an inorganic layer 48 as an environmental barrier coating. The silicon-based substrate 44 may be one of a silicon nitride substrate and a silicon carbide substrate. A ceramic environmental barrier coating 42, for example, a tantalum oxide ($Ta_2O_5$) layer, may be deposited by electron beam physical vapor deposition (EBPVD). With the use of EBPVD, the ceramic environmental barrier coating 42, for example, a tantalum oxide ($Ta_2O_5$) layer may be deposited in the form of columnar grains 30.

In step 210 of FIG. 4, an inorganic layer 48, such as aluminum oxide ($Al_2O_3$), may be deposited, by atomic layer deposition onto the ceramic environmental barrier coating 42, such as a tantalum oxide ($Ta_2O_5$) layer, such that the inorganic layer 48 may be uniform and conformal. The inorganic layer 48 ]ok] may comprise a substance selected from the group consisting of aluminum oxide ($Al_2O_3$), tantalum carbide (TaC), hafnium oxide ($HfO_2$), mixtures thereof, nano-laminates thereof, and alloys thereof. With continuing reference to step 210 of FIG. 4, the inorganic layer 48 may also comprise a substance selected from the group consisting of silicon carbide (SiC), silicon nitride ($Si_3N_4$), oxycarbides, carbonitrides, mixtures thereof, nano-laminates thereof, and alloys thereof.

Figure 5:
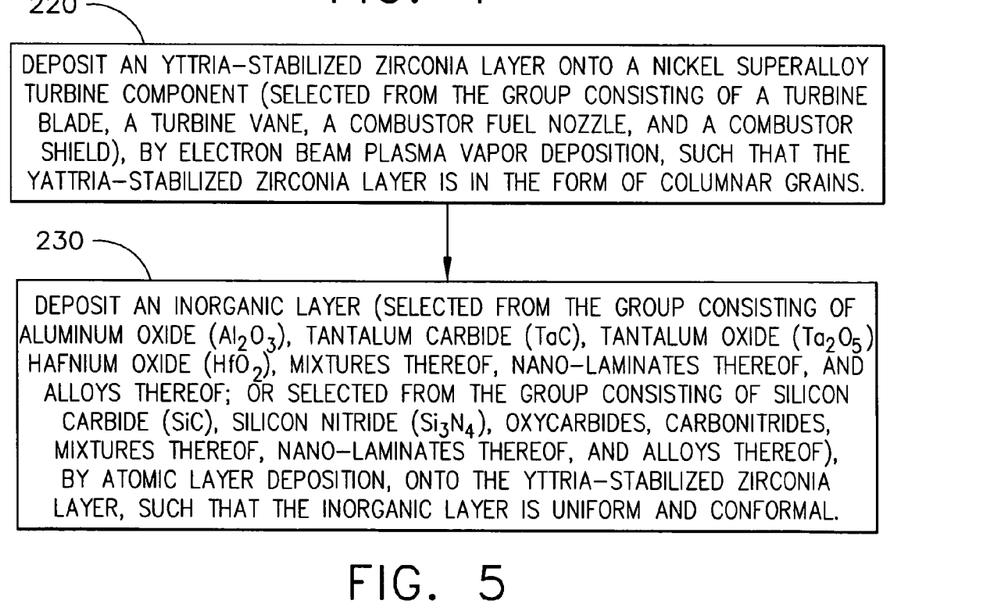
FIG. 5 is a flowchart demonstrating a method for coating nickel-based superalloy gas turbine components, according to an embodiment of the present invention.

While the method shown in FIG. 4 concerned a thermal barrier coating for a silicon-based substrate 44, the method shown in FIG. 5, with reference to FIG. 2 concerns coating a nickel superalloy turbine component 40. A suitable ceramic layer, for example, an yttria-stabilized zirconia layer 28 may be deposited onto a nickel superalloy turbine component 40. The component 40 may be selected from the group consisting of a turbine blade, a turbine vane, a combustor fuel nozzle, and a combustor shield. In step 200 in the flow chart in FIG. 5, an yttria-stabilized zirconia layer 28 may be deposited onto the superalloy substrate 32 by EBPVD, which may result in the yttria-stabilized zirconia layer 28 being in the form of columnar grains 30. Optionally, a bonding coat 34 (for example, NiCrAlY) may be applied before applying the yttria-stabilized zirconia layer 28. In step 230 of FIG. 5, with continuing reference to FIG. 2, an inorganic layer 22 may be deposited onto the superalloy substrate 32. The inorganic layer 22 may comprise a substance selected from the group consisting of aluminum oxide ($Al_2O_3$), tantalum carbide (TaC), tantalum oxide ($Ta_2O_5$), hafnium oxide ($HfO_2$), mixtures thereof, nano-laminates thereof, and alloys thereof. With continuing reference to step 230 of FIG. 5 and FIG. 2, the inorganic layer 22 may also comprise a substance selected from the group consisting of silicon carbide (SiC), silicon nitride ($Si_3N_4$), oxycarbides, carbonitrides, mixtures thereof, nano-laminates thereof, and alloys thereof. The yttria-stabilized zirconia layer 28 may be uniform and conformal.

Figure 6:
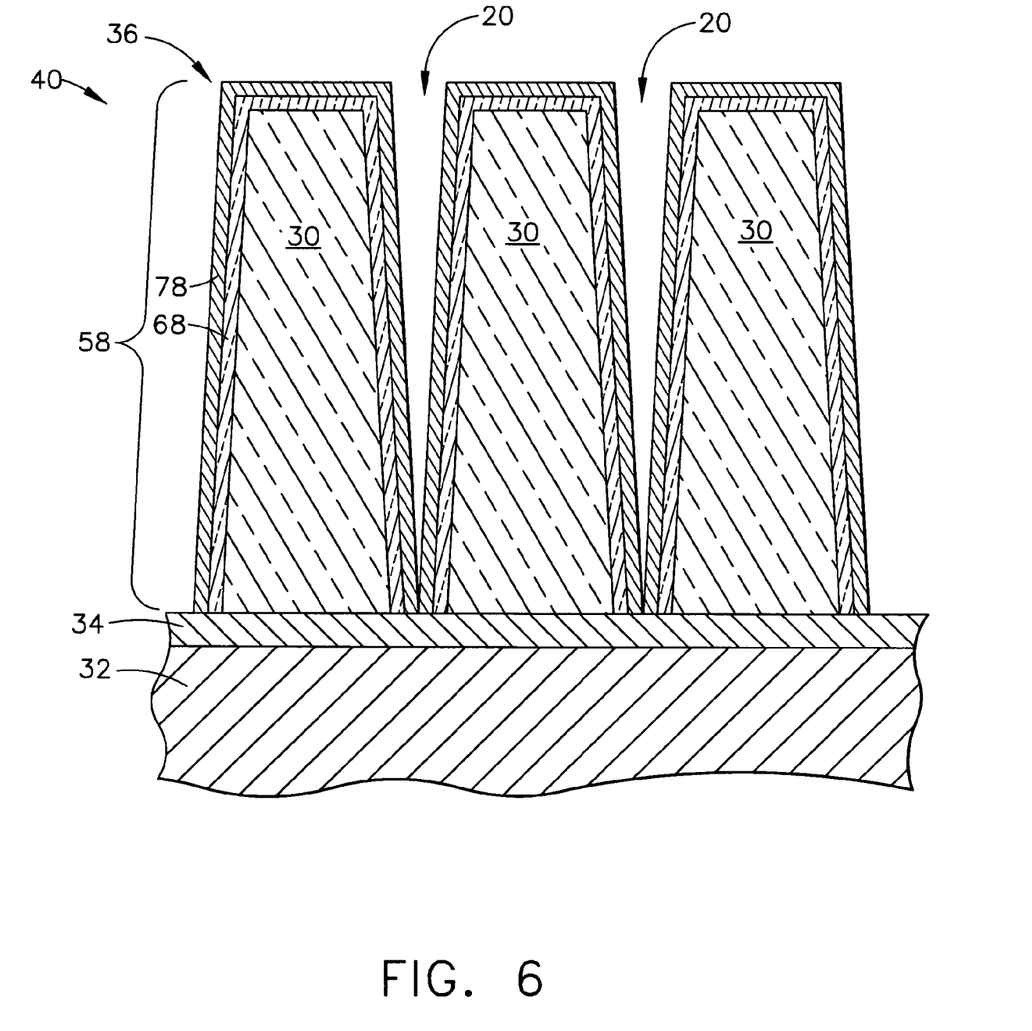
FIG. 6 is a cross sectional schematic view of a thermal barrier coating of columnar grain structure with conformal multi-layered coating on the surface, according to an embodiment of the present invention.

As shown in FIG. 6, a superalloy component 40 may have a ceramic thermal barrier coating 58 on at least a portion of its surface. A superalloy substrate 32 may have the ceramic thermal barrier coating 58 overlying the superalloy substrate 32. The superalloy substrate 32 may also have a bonding coat 34 in between the superalloy substrate 32 and the ceramic thermal barrier coating 58. The ceramic thermal barrier coating 58 may have a first coating layer 68 overlying the ceramic thermal barrier coating 58. The first coating layer 68 may be deposited over the ceramic thermal barrier coating 58 by atomic layer deposition. The first coating layer 68 may have a thickness from about 5 nm to about 5000 nm. The first coating layer 68 may have a plurality of gaps 20 extending from the top surface 36 of the first coating layer 68 towards the substrate 32 and defining a plurality of columns 30 of the first coating layer 68. The plurality of gaps 20 may be micron sized gaps 20 or sub-micron gaps 20. Additionally, the superalloy substrate 32 may have a second coating layer 78 overlying the first coating layer 68 and conformally coating the plurality of gaps 20. The second coating layer 78 may be deposited over the first coating layer 68 by atomic layer deposition.

The first coating layer 68 and the second coating layer 78 may be selected from the group consisting of oxides, carbides, nitrides, silicides, and metals. The oxides may be selected from the group consisting of $Al_2O_3$, $Cr_2O_3$, $Sc_2O_3$, $SiO_2$, $ZrO_2$, and $Ta_2O_5$, $HfO_2$, $TiO_2$, $Ln_2O_3$, MgO, SrO, and alloys and compounds thereof. The nitrides may be selected from the group consisting of TaN, ZrN, HfN, TiN, $Si_3N_4$ and alloys and compounds thereof. The carbides may be selected from the group consisting of SiC, TaC, ZrC, HfC and alloys and compounds thereof. The suicides may be selected from the group consisting of $MoSi_2$, $Mo_5Si_3$, $TaSi_2$, $Ta_5Si_3$, and alloys and compounds thereof. The metals may be selected from the group consisting of Pt, Ru, Rd, Ir, and alloys and compounds thereof.

To fabricate the improved TBC and EBC of the present invention, parts that already have the bonding coat and conventional TBC or EBC on the surface may be loaded into a chamber that can be heated to high temperatures (>500° C.). Either a vacuum type reactor or a flow type reactor may be used in the manufacturing of the products of the present invention. A batch reactor may be used so that multiple parts may be coated. The chamber may either be evacuated by a vacuum pump and maintain in vacuum, or back-filled with an inert gas, such as Ar, while maintaining a continuous flow of Ar. The parts may be heated to a temperature window in which the atomic layer deposition process occurs, typically in the temperature range of 100 to 500° C., and most likely to be in the temperature range of 200-400° C. With the parts in the chamber heated to the desirable temperature, a dose of precursor gas may be pulsed into the chamber. The precursor contains a chemical element that is one of the constituents of the film to be deposited. As an example, if the goal is to form $Al_2O_3$ film on the columnar grain surface, the precursor gas would contain aluminum. Another precursor to be used may be Trimethyl aluminum $[Al(CH_3)_3]$, of the alkyl group. Another precursor may also be halide, such as $AlCl_3$. When the metal precursor is pulsed into the chamber, the precursor gas may chemically adsorb onto the part surface and form a monolayer of molecule. Because of the nature of this process, the precursor gas forms a monolayer of molecules uniformly on all the surfaces of the parts. Even though the opening of the gap between the columnar grains in the EBPVD TBC may be sub-micron size, the precursor gas molecule may diffuse through the opening and coat the deepest surface within the gap. The pulse time of this step may be less than 10 seconds, preferably less than 5 seconds, and most preferably less than one second. After this pulsing step, the chamber may be evacuated or purged with inert gas to remove any non-absorbed precursor gas. This evacuation or purging step may take ten seconds, preferably less than 5 seconds, and most preferably less than one second. After the purge, another dose of a precursor gas, this time a precursor that contains the non-metal element in the coating, may be pulsed into the chamber. For instance, to form the $Al_2O_3$ coating, the second precursor may be $H_2O$ vapor, or oxygen, or ozone. Using $H_2O$ precursor as the example, the $H_2O$ molecule may react with the previously adsorbed monolayer of $Al(CH_3)_3$ on the columnar grain surface, and form a new layer of $Al-(OH)_x$ molecules as the reaction product, and the exhaust gas of $CH_4$. Following another purge to remove the residual $H_2O$ and $CH_4$, a new dose of a metal-containing precursor such as the $Al(CH_3)_3$ may be pulsed into the chamber. Again, the metal-containing precursor may react on the surface of the parts to form a new monolayer of molecules. In the example of forming $Al_2O_3$, the fresh $Al(CH_3)_3$ precursor may react with the previously formed $Al-(OH)_x$ molecule to form $Al-O-Al-(CH_3)_y$ on the surface and gas exhaust of $CH_4$. By sequentially repeating the pulse and purge steps of the precursors, a uniform, conformal, fully dense, and pinhole-free layer of $Al_2O_3$ may be formed that covers all the gap surface of the TBC. Each cycle of pulsing and purging two different precursors to form a compound may create a layer thickness of about one angstrom. By counting the numbers of deposition cycles, a coating of accurate thickness with extreme uniformity and conformity may be formed. To form laminates of two or more different alternating coatings, any time during the deposition a different metal-precursor may be used to form a new layer of material. To form an atomically mixed alloy of different elements, a mixed precursor of those elements may be used.

Furthermore, this invention covers the manufacturing of TBC and EBC by combining the processes of etching the columnar-grained TBC and EBC, followed by atomic layer deposition. The etching may be wet-chemical or plasma-gas dry etching for ZrO2, HfO2, and Ta2O5 materials, using the known chemicals and processes in the chemical and semiconductor industries. In wet etching, etching solutions containing HF may be used, while in the dry etching, typically chlorine and fluorine containing plasma gases may be used. Following in the etching of the TBC and EBC, the parts may be rinsed, cleaned, dried, and loaded into an atomic layer deposition chamber for the deposition steps. By etching the TBC and the EBC, the gaps in those coatings may be widened, and thicker layers with tailored compositions may be deposited by atomic layer deposition. This etching process may reduce the gap-space limitation imposed by the as-grown EBPVD columnar grains, and may enable the development of tailored compositions and laminates of various coatings by atomic layer deposition.

Although the present invention has been described in considerable detail with reference to certain preferred versions thereof, other versions are possible. Therefore, the spirit and scope of the appended claims should not be limited to the description of the preferred versions contained therein.

I claim:

1. A method for forming a thermal barrier coating on a gas-turbine engine having a silicon-based substrate disposed thereon, the method comprising:

depositing a tantalum oxide ($Ta_2O_5$) layer onto a silicon-based substrate, by electron beam physical vapor deposition, to form a topography such that the tantalum oxide ($Ta_2O_5$) layer is in the form of columnar grains having gaps therebetween; and depositing an inorganic layer, by atomic layer deposition, onto the tantalum oxide ($Ta_2O_5$) layer, such that the inorganic layer is of substantially uniform thickness and is substantially conformal to the topography of the tantalum oxide layer to thereby form said thermal barrier coating on said gas-turbine engine.

2. The method of claim 1, further comprising depositing a bonding coat onto the silicon-based substrate, by atomic layer deposition, before depositing the tantalum oxide ($Ta_2O_5$) layer.

3. The method of claim 1, wherein the inorganic layer is selected from the group consisting of aluminum oxide ($Al_2O_3$), tantalum carbide (TaC), hafnium oxide ($HfO_2$), mixtures thereof, nano-laminates thereof, and alloys thereof.

4. The method of claim 1, wherein the inorganic layer is selected from the group consisting of silicon carbide (SiC), silicon nitride ($Si_3N_4$), oxycarbides, carbonitrides, mixtures thereof, nano-laminates thereof, and alloys thereof.

5. The method according to claim 1, wherein the silicon-based substrate is one of a silicon nitride substrate and a silicon carbide substrate.

6. The method according to claim 1, wherein the baffler coating preserves the gaps between the columnar grains of the tantalum oxide layer to thereby prevent sintering therebetween.

* * * * *

UNITED STATES PATENT AND TRADEMARK OFFICE
CERTIFICATE OF CORRECTION

PATENT NO. : 7,285,312 B2  
APPLICATION NO. : 10/759810  
DATED : October 23, 2007  
INVENTOR(S) : Chien-Wei Li Page 1 of 1

It is certified that error appears in the above-identified patent and that said Letters Patent is hereby corrected as shown below:

Column 12, line 6, "baffler" should be changed to --barrier--

Signed and Sealed this

Twentieth Day of May, 2008

JON W. DUDAS  
*Director of the United States Patent and Trademark Office*